(12) United States Patent
Chen

(10) Patent No.: US 9,275,691 B2
(45) Date of Patent: Mar. 1, 2016

(54) PROGRAMMABLE VOLTAGE GENERATOR FOR NONVOLATILE MEMORY DEVICE

(71) Applicant: ELITE SEMICONDUCTOR MEMORY TECHNOLOGY INC., Hsinchu (TW)

(72) Inventor: Chung-Zen Chen, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 20 days.

(21) Appl. No.: 14/221,939

(22) Filed: Mar. 21, 2014

(65) Prior Publication Data

US 2015/0269975 A1    Sep. 24, 2015

(51) Int. Cl.
*G11C 16/00* (2006.01)
*G11C 5/14* (2006.01)
*G11C 16/12* (2006.01)

(52) U.S. Cl.
CPC ............. *G11C 5/147* (2013.01); *G11C 5/145* (2013.01); *G11C 16/12* (2013.01)

(58) Field of Classification Search
CPC .......... G11C 5/147; G11C 5/145; G11C 5/06
USPC ............... 365/226, 227, 189.07, 189.09
See application file for complete search history.

(56) References Cited

U.S. PATENT DOCUMENTS 5,444,412 A * 8/1995 Kowalski ................. 327/541
2002/0005737 A1 * 1/2002 Keeth et al. ............... 327/51

* cited by examiner

*Primary Examiner* — Pho M Luu
*Assistant Examiner* — Xiaochun L Chen
(74) *Attorney, Agent, or Firm* — Li & Cai Intellectual Property (USA) Office

(57) ABSTRACT

An exemplary embodiment of the present disclosure provides a programming voltage generator for a nonvolatile memory device. The programming voltage generator comprises a power circuit, a detector, a switching circuit, a control signal generator, and a regulation circuit. The power circuit outputs a programming voltage according to a voltage control signal. The detector detects whether the programming voltage is larger than or equal to a breakdown voltage of the nonvolatile memory device, so as to output an indication signal. The switching circuit temporally drops the programming voltage according to the indication signal. The control signal generator generates a plurality of regulation control signals. The regulation circuit generates the voltage control signal according to the programming voltage and the regulation control signals.

9 Claims, 4 Drawing Sheets

PROGRAMMABLE VOLTAGE GENERATOR FOR NONVOLATILE MEMORY DEVICE

BACKGROUND

1. Technical Field

The present invention relates to a nonvolatile memory device, and more particularly to a programmable voltage generator for the nonvolatile memory device.

2. Description of Related Art

In integrated memory devices, a high voltage source or generator (i.e. programmable voltage generator) is required for word line pumping or to supply a programming voltage in the nonvolatile memory devices. The output level of the high voltage source is programmable, and in general the output level can be set by fuses and stepping up with programming shot to shorten the programming time. Thus, it is possible that the output voltage of the high voltage source is higher than the level which can be sustained by the memory device. The memory device, at least, includes row decoder, column decoder, memory cell, and so on. The programmable voltage generator provides a programming voltage greater than required by a load device (such as a memory cell and word line decoder or sustainable voltage in the programmable voltage generator).

However, if the programming voltage provided by the programmable voltage generator is higher than a breakdown voltage of the load device or the device in the programmable voltage generator, the load device or the programmable voltage generator may be failed or useless. Therefore, a limiting circuit is connected in parallel with the programmable voltage generator and the load device to limit the maximum level of the programming voltage provided by the programmable voltage generator.

In a continuous operation, the programmable voltage generator programming voltage can provide the sufficient current to supply the load device at the limited programming voltage, thus programming the load device successfully. Unfortunately, the programming voltage required by the load device is varying along with the semiconductor process variation, and that is, the load devices made of by the different semiconductor processes may have different programming voltages. The integrated circuit designer must design the different limiting circuits for the load devices made of by the different semiconductor processes, and thus it increases the product cost and design time for manufacturing the nonvolatile memory devices.

SUMMARY

An exemplary embodiment of the present disclosure provides a programming voltage generator for a nonvolatile memory device. The programming voltage generator comprises a power circuit, a detector, a switching circuit, a control signal generator, and a regulation circuit. The power circuit outputs a programming voltage according to a voltage control signal. The detector detects whether the programming voltage is larger than or equal to a breakdown voltage of the nonvolatile memory device, so as to output an indication signal. The switching circuit temporally drops the programming voltage according to the indication signal. The control signal generator generates a plurality of regulation control signals. The regulation circuit generates the voltage control signal according to the programming voltage and the regulation control signals.

To sum up, the exemplary embodiment of the present disclosure provides a programming voltage generator to generate a programming voltage less than the breakdown voltage of the nonvolatile memory device, thus preventing the nonvolatile memory device from damage or failure.

For further understanding of the instant disclosure, reference is made to the following detailed description illustrating the embodiments and examples of the instant disclosure. The description is for illustrative purpose only and is not intended to limit the scope of the claim.

DETAILED DESCRIPTION OF THE PREFERRED EMBODIMENTS

Figure 1:
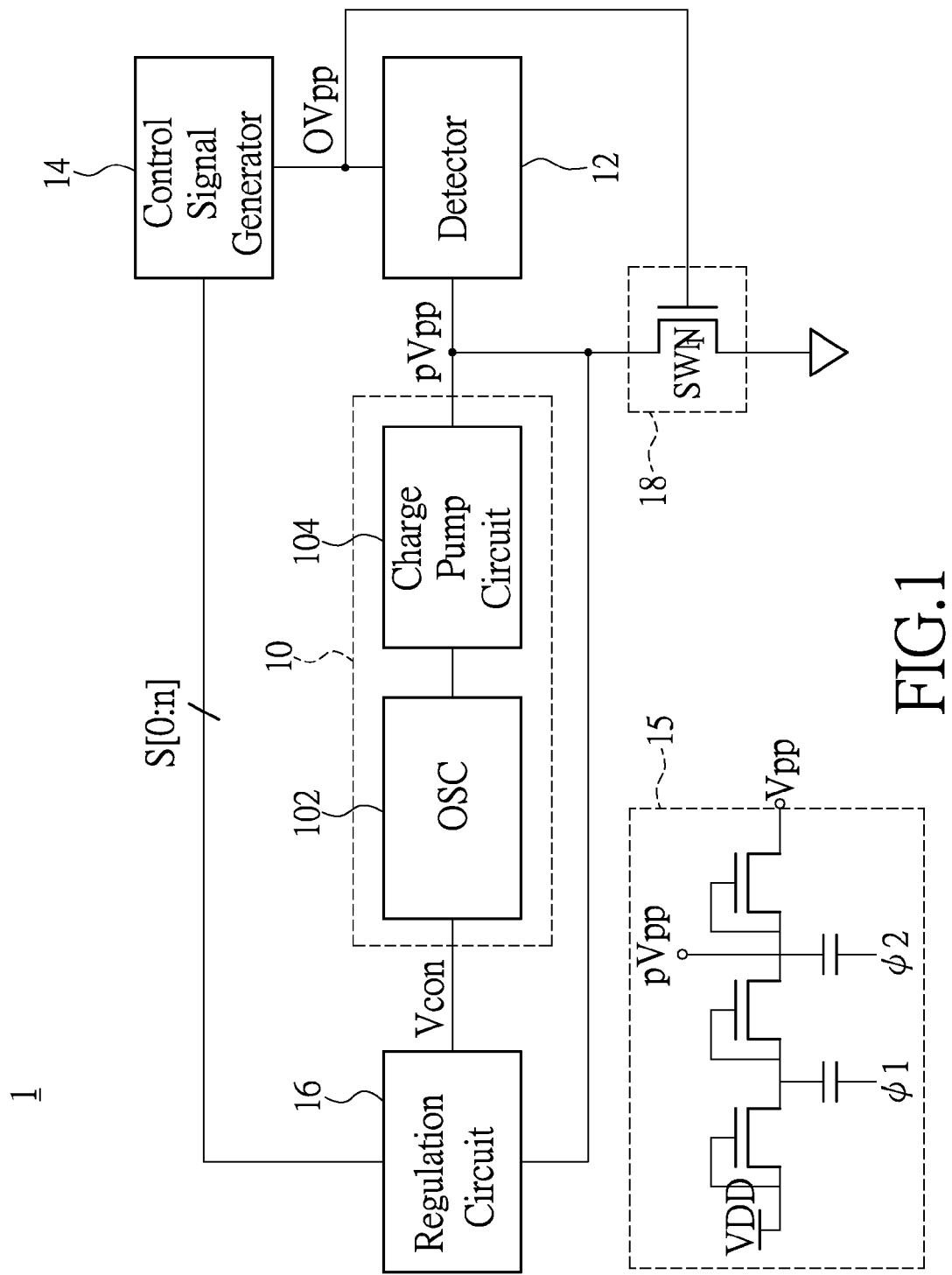
FIG. 1 is a block diagram of a programmable voltage generator for a nonvolatile memory according to an exemplary embodiment of the present disclosure.

Please refer to FIG. 1, FIG. 1 is a block diagram of a programmable voltage generator for a nonvolatile memory according to an exemplary embodiment of the present disclosure. The programmable voltage generator 1 comprises a power circuit 10, a detector 12, a control signal generator 14, a level shifter 15, a regulation circuit 16, and a switching circuit 18.

An output end of the power circuit 10 is electrically connected to an input end of the detector 12, an input end of the level shifter 15, a first end of the switching circuit 18, and an input end of the regulation circuit 16. An output end of the detector 12 is electrically connected to an input end of the control signal generator 14 and a control end of the switching circuit 18. An output port is electrically connected to a control port of the regulation circuit 16 through a bus line. An output end of the regulation circuit 16 is electrically connected to the power circuit 10. A second end of the switching circuit 18 is electrically connected to a low voltage level, such as the ground.

In the exemplary embodiment, the power circuit 10 receives the voltage control signal Vcon, and outputs the programmable voltage signal pVpp according to the voltage control signal Vcon. The level shifter 15 receives the programmable voltage signal pVpp, and outputs the level shifted programmable voltage signal Vpp. The implementation details of the power circuit 10 are illustrated as follows, but the following implementation is not used to limit the present disclosure.

The power circuit 10 for example comprises a oscillator (OSC) 102 and a charge pump circuit 104, wherein an output end of the oscillator 102 is electrically connected to an input end of the charge pump circuit 104, an input end of the oscillator 102 is electrically connected to the output end of the regulation circuit 16, and an output end of the charge pump circuit is electrically connected to the input end of the detector 12, the first end of the switching circuit 18, and the input end of the regulation circuit 16.

The oscillator 102 receives a voltage control signal Vcon output from the regulation circuit 16, and outputs an oscillating voltage signal according to the voltage control signal Vcon, wherein the level of the voltage control signal Vcon is at logical high level. The charge pump circuit 104 receives the oscillating voltage signal, and outputs a programmable voltage pVpp according to the oscillating voltage signal.

The detector 12 receives the programming voltage pVpp, and detects whether the programming voltage pVpp is larger than or equal to a breakdown voltage of the nonvolatile memory device, so as to output an indication signal OVpp. The indication signal is asserted when the programming voltage pVpp is larger than or equal to a breakdown voltage.

It is noted that the detector 12 and the nonvolatile memory device are made of by the same semiconductor process, such that a breakdown voltage of an element (such as a diode) in the detector 12 is identical to the breakdown voltage of the nonvolatile memory device. Thus, for the nonvolatile memory devices with the different semiconductor processes, the integrated circuit designer should not re-design detector 12, and the design cost and time of the detector 12 is reduced.

The first end and the second end of the switching circuit 18 are conductive when the indication signal is asserted, so as to temporarily drop the level of the programming voltage pVpp. It is noted that the level of the programming voltage pVpp is temporarily dropped to avoid the concern of latch up, and the regulation mechanism for the programming pVpp performed by the regulation circuit 16 is needed.

The switching circuit 18 can be implemented by a NMOS transistor $SWN_1$, but the present disclosure is not limited thereto. A gate of the NMOS transistor $SWN_1$ is served as the control end of the switching circuit 18, and a source and drain of the NMOS transistor $SWN_1$ are respectively served as the first and second ends of the switching circuit 18.

The control signal generator 14 receives the indication signal OVpp, and generates the regulation control signals S[0:n] according to the indication signal OVpp, wherein n is an integer larger than 0. The initial values of S'[0:n] are set by the stepping voltage generator.

The regulation circuit 16 receives the programming voltage pVpp and the regulation control signals S[0:n], and generates a voltage control signal Vcon according to the programming voltage pVpp and the regulation control signals S[0:n]. The level of the voltage control signal Vcon is turned to logical high level after the switching circuit 18 temporarily drops the level of the programming voltage pVpp once. When the voltage control signal Vcon is at a logic high level, the power circuit 10 initiates the pumping of the charge pump circuit 104 to be activated.

Figure 2:
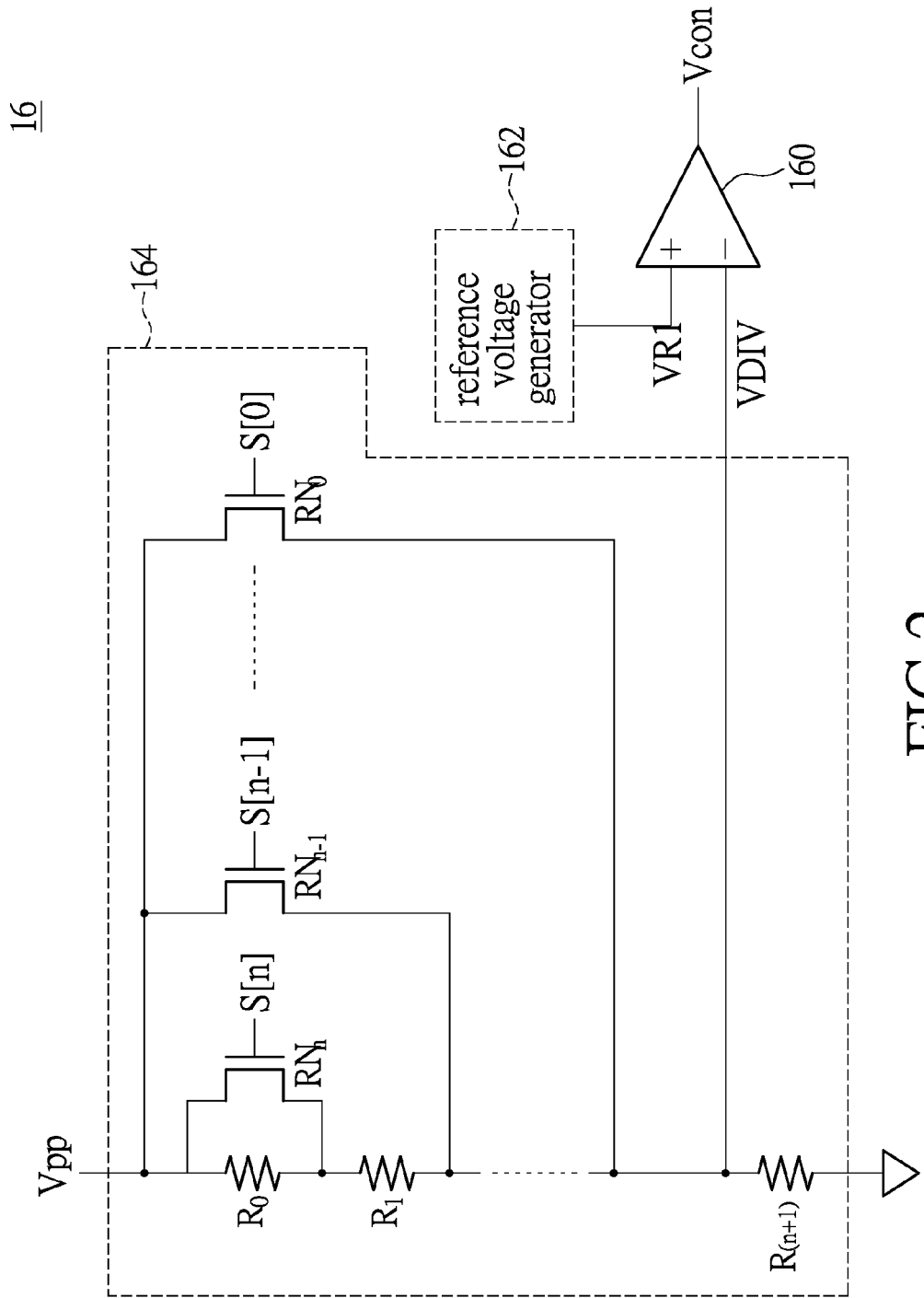
FIG. 2 is a circuit diagram of a regulation circuit associated with a programmable voltage generator for a nonvolatile memory according to an exemplary embodiment of the present disclosure.

Referring to FIG. 2, FIG. 2 is a circuit diagram of a regulation circuit associated with a programmable voltage generator for a nonvolatile memory according to an exemplary embodiment of the present disclosure. However, the implementation of the regulation circuit 16 shown in FIG. 2 is not used to limit the present disclosure.

The control circuit 16 in FIG. 2 comprises a comparator 160, a reference voltage generator 162, and a programmable voltage divider 164. An input end of the programmable voltage divider 164 receives the programming voltage pVpp, and an output end of the programmable voltage divider 164 is electrically connected to a negative input end of the comparator 160. A positive input end of the comparator 160 receives a first reference voltage VR1 output from the reference voltage generator 162, and an output end of the comparator 160 is electrically connected to the input end of the power circuit 10.

The programmable voltage divider 164 receives the programming voltage pVpp and regulation control signals S[0:n], and outputs a divided voltage VDIV according to the programming voltage pVpp and regulation control signals S[0:n]. The comparator 160 compares the first reference voltage VR1 and the divided voltage VDIV to output the voltage control signal Vcon.

When the programming voltage pVpp is larger than or equal to the breakdown voltage of the nonvolatile memory device, and the level the divided voltage VDIV is increased-larger than the first reference voltage VR1, the level of the voltage control signal Vcon is at the logic low level, and thus the power circuit stops charge pumping.

The programmable voltage divider 164 comprises plurality of resistors $R_0 \sim R_{(n+1)}$ and a plurality of NMOS transistors $RN_0 \sim RN_n$. Second ends of the resistors $R_0 \sim R_n$ are electrically connected to the first ends of the resistors $R_1 \sim R_{(n+1)}$ respectively. Drains of the NMOS transistors $RN_0 \sim RN_0$ are electrically connected to the first end of the resistor $R_0$ to receive the programming voltage pVpp, and sources of the NMOS transistors $RN_n \sim RN_0$ are electrically connected to second ends of the resistors $R_0 \sim R_n$ respectively. Gates of the NMOS transistors $RN_n \sim RN_0$ respectively receives the regulation control signals S[0:n].

When the programming voltage pVpp is larger than the breakdown voltage of the nonvolatile memory device and the regulation control signal S[k] is selected at logic high level, the regulation control signal S[k−1] will be selected, the divided voltage VDIV is increased, the divided voltage VDIV is larger than the first reference voltage VR1, and the programming voltage pVpp is lowered.

Figure 3:
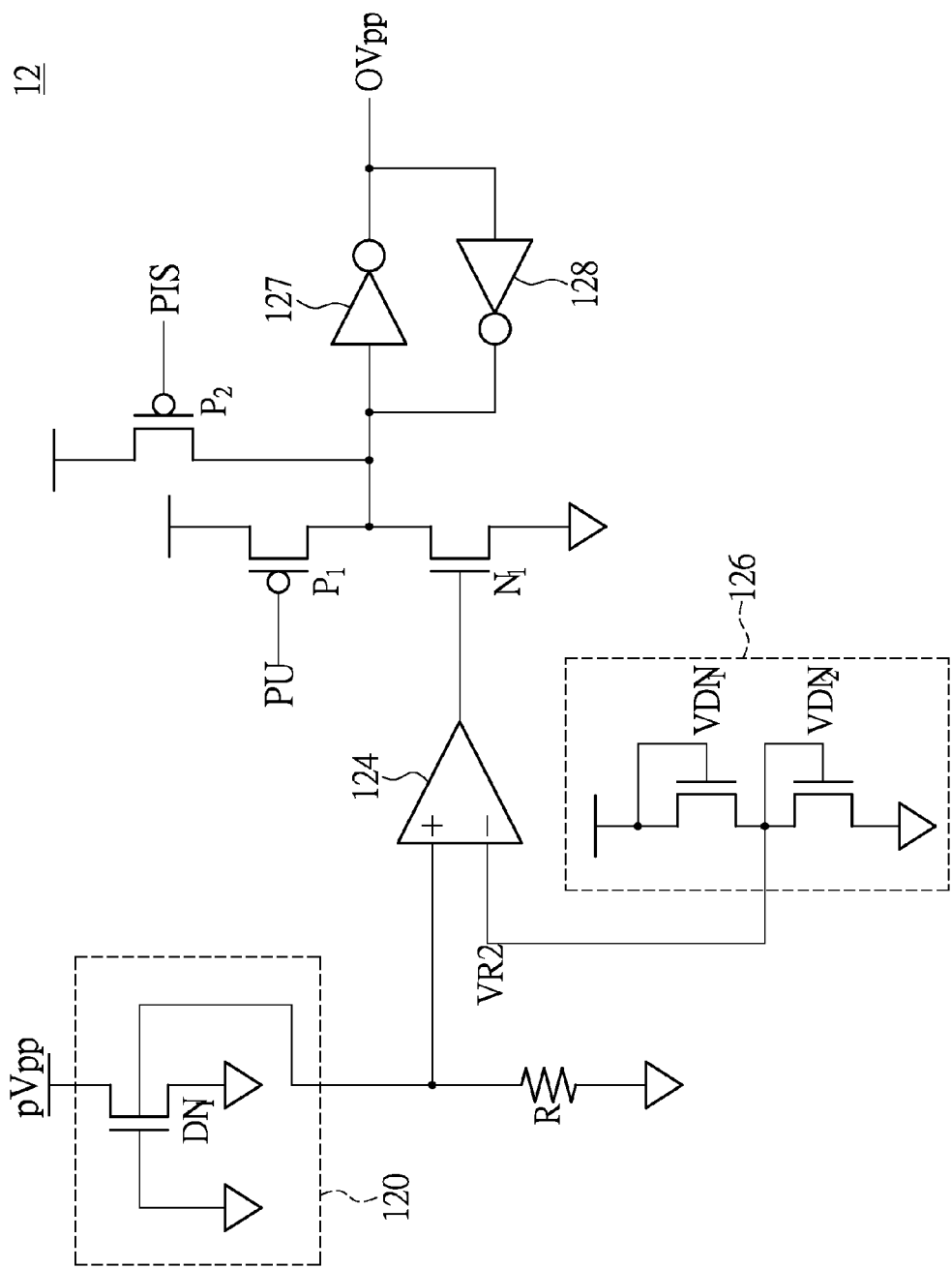
FIG. 3 is a circuit diagram of a detector associated with a programmable voltage generator for a nonvolatile memory according to an exemplary embodiment of the present disclosure.

Referring to FIG. 3, FIG. 3 is a circuit diagram of a detector associated with a programmable voltage generator for a nonvolatile memory according to an exemplary embodiment of the present disclosure. However, the implementation of the detector 12 shown in FIG. 3 is not used to limit the present disclosure.

The detector 12 comprises a diode 120, a resistor R, a comparator 124, a voltage divider 126, PMOS transistors $P_1$, $P_2$, a NMOS transistor $N_1$, and two inverters 127, 128. A cathode of the diode 120 receives the programming voltage pVpp, and an anode is electrically connected to a first end of the resistor R and a positive input end of the comparator 124. A negative end of the comparator 124 receives a second reference voltage VR2 output from the voltage divider 126. The gate of the PMOS transistor $P_1$ is connected to a power up signal PU, and a gate of the PMOS transistor $P_2$ is connected to a programming initial shot signal PIS. Sources of the PMOS transistors $P_1$, $P_2$ are electrically connected to a high voltage (such as VCC), and a source of the NMOS transistor $N_1$ is electrically connected to the ground. All drains of the PMOS transistors $P_1$, $P_2$ and the NMOS transistor $N_1$ are electrically connected to an input end of the inverter 127 and an output end of the inverter 128. An output end of the inverter 127 is electrically connected to an input end of the inverter 128.

The diode 120 can be implemented by a NMOS transistor DN1, wherein a drain of the NMOS transistor DN1 receives the programming voltage pVpp, a gate and a source of the NMOS transistor DN1 are electrically connected to the ground, and a body of the NMOS transistor DN1 is electrically connected to a first end the resistor R and the positive input end of the comparator 124. The diode 120 may have the other implementations, and the present disclosure is not limited thereto.

In the exemplary embodiment, the voltage divider 126 comprises two NMOS transistors $VDN_1$ and $VDN_2$ which forms a string of two resistors to output the second reference voltage VR2, but the present disclosure is not limited thereto.

When the programming voltage Vpp is larger than or equal to the breakdown voltage of the nonvolatile memory device, the diode 120 is turned on, and a voltage crossing the resistor R is generated. When the voltage crossing the resistor R is large than VR2, the comparator 124 thus outputs a positive voltage signal. Thus, the NMOS transistor $N_1$ is turned on, and the indication signal OVpp is asserted.

When the programming voltage Vpp is less than the breakdown voltage of the nonvolatile memory device, the diode 120 is turned off, and a voltage crossing the resistor R is zero. When the voltage crossing the resistor R is the zero, the comparator 124 thus outputs a negative voltage signal. Thus, the NMOS transistor $N_1$ is turned off, and the indication signal OVpp is deasserted.

Figure 4:
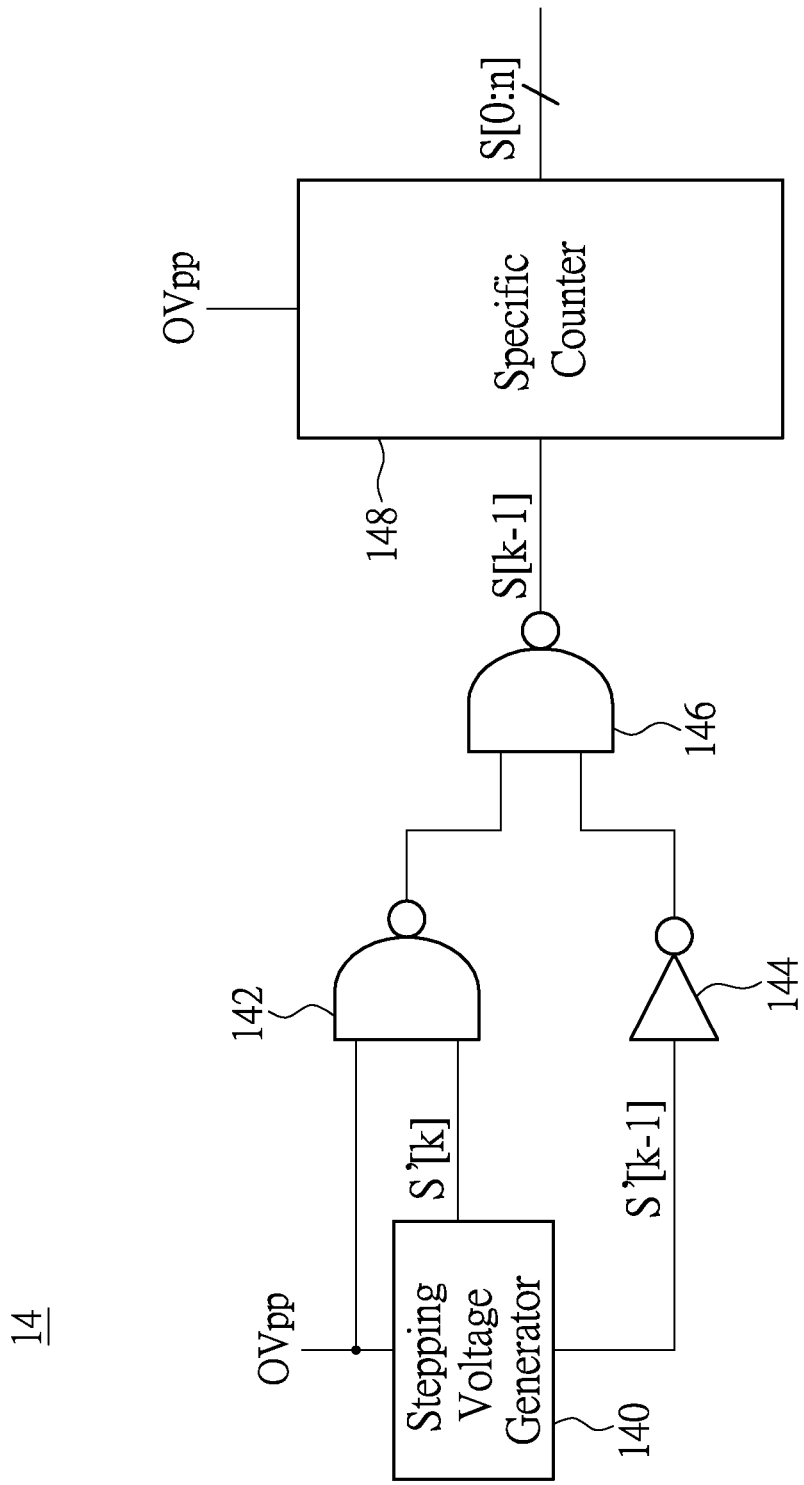
FIG. 4 is a circuit diagram of a control signal generator associated with a programmable voltage generator for a nonvolatile memory according to an exemplary embodiment of the present disclosure.

Referring to FIG. 4, FIG. 4 is a circuit diagram of a control signal generator associated with a programmable voltage generator for a nonvolatile memory according to an exemplary embodiment of the present disclosure. However, the implementation of the control signal generator 14 shown in FIG. 4 is not used to limit the present disclosure.

The control signal generator 14 comprises a stepping voltage generator 140, NAND gates 142, 146, an inverter 144, and a specific counter 148. An input end of the stepping voltage generator 140 receives the indication signal OVpp, and output ends of the stepping voltage generator 140 are electrically connected to input ends of the NAND gate 142 and the inverter 144. Another one input end of the NAND gate 142 receives the indication signal OVpp. Output ends of the NAND gate 142 and the inverter 144 are respectively electrically connected to input ends of the NAND gate 146. An output end of the NAND gate 146 is electrically connected to the specific counter.

The stepping voltage generator 140 outputs control signals S'[k] and S'[k−1] according to fuse setting and intended stepping voltage design. The pVpp voltage can be stepped to a higher level to shorten the programming time in flash device. One of the initial value of the control signals S'[0:n] is 1 and the others are 0. Then, if the indication signal OVpp is asserted, the selected control signal S'[k] will become S[k−1] by the circuit in FIG. 4. The programmable voltage signal pVpp will drop a level to avoid junction breakdown.

Although the present disclosure has been described in considerable detail with reference to certain preferred embodiments thereof, the disclosure is not for limiting the scope of the disclosure. Persons having ordinary skill in the art may make various modifications and changes without departing from the scope and spirit of the disclosure. Therefore, the scope of the appended claims should not be limited to the description of the preferred embodiments described above.

What is claimed is:

1. A programming voltage generator for a nonvolatile memory device, comprising:
    a power circuit, for outputting a programming voltage according to a voltage control signal;
    a detector, for detecting whether the programming voltage is larger than or equal to a breakdown voltage of the nonvolatile memory device, so as to output an indication signal;
    a switching circuit, for temporally dropping the programming voltage according to the indication signal;
    a control signal generator, for generating a plurality of regulation control signals; and
    a regulation circuit, for generating the voltage control signal according to the programming voltage and the regulation control signals;
    wherein the regulation circuit comprises:
        a programmable voltage divider, for generating a divided voltage according to the programming voltage and the regulation control signals; and
        a comparator, for comparing the divided voltage and a reference voltage to output the voltage control signal.

2. The programming voltage generator according to claim 1, wherein the indication signal is asserted when the programming voltage is larger than or equal to the breakdown voltage.

3. The programming voltage generator according to claim 1, wherein the regulation circuit outputs the voltage control signal to control the power circuit to drop the programming voltage several times or once until the programming voltage is less than the breakdown voltage.

4. The programming voltage generator according to claim 1, wherein the power circuit comprises:
    an oscillator, for generating an oscillating voltage signal with a frequency, wherein the frequency is determined by the level of the voltage control signal; and
    a charge pump circuit, for generating the programming voltage according to the frequency of the oscillating voltage signal.

5. The programming voltage generator according to claim 1, wherein the switching circuit comprises a NMOS transistor.

6. The programming voltage generator according to claim 1, wherein the programmable voltage divider comprises:
    a $0^{th}$ through $(n+1)^{th}$ resistors, second ends of the first through $(n+1)^{th}$ resistors are respectively electrically connected to first ends of the $0^{th}$ through $n^{th}$ resistors, a first end of the $0^{th}$ receives the programming voltage, a second end of the $(n+1)^{th}$ resistor is electrically connected to a ground; and
    a $n^{th}$ through $0^{th}$ transistors, drains of the $n^{th}$ through $0^{th}$ transistors receives the programming voltage, sources of the $n^{th}$ through $0^{th}$ transistors are respectively electrically connected to the second ends of $0^{th}$ through $n^{th}$ resistors, and gates of the $n^{th}$ through $0^{th}$ transistors respectively receives $n^{th}$ through $0^{th}$ regulation control signals of the regulation control signals.

7. The programming voltage generator according to claim 1, wherein the regulation circuit further comprises a reference voltage generator for outputting the reference voltage.

8. The programming voltage generator according to claim 1, wherein the detector comprises:
    a diode, a cathode thereof receives the programming voltage;
    a resistor, a first end thereof is electrically connected to an anode of the diode, a second end thereof is electrically connected to a ground;
    a comparator, a positive input end thereof is electrically connected to the first end of the resistor, a negative input end thereof is electrically connected to a reference voltage;
    a NMOS transistor, a source thereof is electrically connected to the ground, a gate thereof is electrically connected to an output end of the comparator;
    a PMOS transistor, a source thereof is electrically connected to a high voltage, a drain thereof is electrically connected to a drain of the NMOS transistor, a gate thereof receives a reset signal;
    a first inverter, an input end thereof is electrically connected to the drains of NMOS and PMOS transistors, an output end thereof outputs the indication signal; and
    a second inverter, an input and output ends thereof are respectively electrically connected to the output and input ends of the first inverter.

9. The programming voltage generator according to claim 8, wherein the detector further comprises a voltage divider for outputting the reference voltage.

* * * * *